US012682939B2

(12) United States Patent
Chuang et al.

(10) Patent No.: US 12,682,939 B2
(45) Date of Patent: Jul. 14, 2026

(54) MAGNETORESISTIVE RANDOM-ACCESS MEMORY (MRAM) CELL AND METHOD OF OPERATION THEREOF

(71) Applicant: Taiwan Semiconductor Manufacturing Company, Ltd., Hsin-Chu (TW)

(72) Inventors: Harry-Hak-Lay Chuang, Zhubei City (TW); Ching-Huang Wang, Hsinchu (TW); Hung Cho Wang, Hsinchu (TW); Tien-Wei Chiang, Taipei City (TW); Wen-Chun You, Yilan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 75 days.

(21) Appl. No.: 18/364,674

(22) Filed: Aug. 3, 2023

(65) Prior Publication Data

US 2024/0339144 A1 Oct. 10, 2024

Related U.S. Application Data

(60) Provisional application No. 63/494,615, filed on Apr. 6, 2023.

(51) Int. Cl.
*G11C 11/16* (2006.01)
(52) U.S. Cl.
CPC ...... *G11C 11/1675* (2013.01); *G11C 11/1655* (2013.01); *G11C 11/1657* (2013.01)

(58) Field of Classification Search
CPC .................................................. G11C 11/1675
See application file for complete search history.

(56) References Cited

U.S. PATENT DOCUMENTS

| | | | |
|---|---|---|---|
| 6,909,631 B2 * | 6/2005 | Durlam | G11C 11/15 365/158 |
| 7,166,881 B2 * | 1/2007 | Lin | H10B 61/22 257/E27.005 |
| 7,872,905 B2 * | 1/2011 | Florez Marino | G11C 11/161 365/158 |

(Continued)

FOREIGN PATENT DOCUMENTS

| | | |
|---|---|---|
| JP | 2008243933 A | 10/2008 |
| TW | 201724490 A | 7/2017 |
| TW | 202312160 A | 3/2023 |

*Primary Examiner* — Douglas King
(74) *Attorney, Agent, or Firm* — HAYNES AND BOONE, LLP

(57) ABSTRACT

An exemplary magnetoresistive random-access memory (MRAM) cell is configured to store more than one bit. The MRAM cell includes a first magnetic tunneling junction (MTJ) and a second MTJ connected in parallel. The first MTJ has a first diameter, the second MTJ has a second diameter, and the second diameter is less than the first diameter. The MRAM cell further includes a transistor connected to the first MTJ and the second MTJ, a bit line connected to the first MTJ and the second MTJ, a word line connected to the transistor, and a source line connected to the transistor. A method of writing to the MRAM cell can include supplying one or more write voltages to the MRAM cell (e.g., having different levels) depending on an initial memory state and a desired memory state of the MRAM cell.

20 Claims, 5 Drawing Sheets

100 —

| | MEMORY STATE 1 | MEMORY STATE 2 | MEMORY STATE 3 | MEMORY STATE 4 |
|---|---|---|---|---|
| Binary Code | 00 | 10 | 11 | 01 |
| Resistance | $\dfrac{Rp1 \times Rp2}{Rp1 + Rp2}$ | $\dfrac{Rap1 \times Rp2}{Rap1 + Rp2}$ | $\dfrac{Rap1 \times Rap2}{Rap1 + Rap2}$ | $\dfrac{Rp1 \times Rap2}{Rp1 + Rap2}$ |
| Write Voltage | $V^+_{Max}$ | $V^-$ | $V^-_{Max}$ | $V^+$ |
| Schematic Plot | | | | |

(56)     References Cited

U.S. PATENT DOCUMENTS

| | | | | |
|---|---|---|---|---|
| 10,559,338 | B2 | 2/2020 | Tzoufras et al. | |
| 10,707,413 | B1 * | 7/2020 | Dutta .................... | H10N 50/01 |
| 2004/0047204 | A1 * | 3/2004 | Hung ..................... | G11C 11/16 365/202 |
| 2008/0094882 | A1 | 4/2008 | Asano et al. | |
| 2013/0044537 | A1 | 2/2013 | Ishigaki et al. | |
| 2018/0068702 | A1 * | 3/2018 | Jung ...................... | H10N 50/85 |
| 2019/0206465 | A1 * | 7/2019 | Bozdag .............. | G11C 11/1675 |
| 2019/0206472 | A1 * | 7/2019 | Bozdag ................. | H10N 50/85 |
| 2019/0206939 | A1 * | 7/2019 | Bozdag ................. | G11C 11/00 |
| 2019/0334080 | A1 | 10/2019 | Ahmed et al. | |
| 2021/0193204 | A1 * | 6/2021 | Jaiswal ................. | H10N 50/10 |
| 2022/0238796 | A1 | 7/2022 | Sonobe et al. | |
| 2022/0399049 | A1 * | 12/2022 | Tezuka ................. | G11C 13/004 |

* cited by examiner

MAGNETORESISTIVE RANDOM-ACCESS MEMORY (MRAM) CELL AND METHOD OF OPERATION THEREOF

This is a non-provisional application of and claims benefit of U.S. Provisional Patent Application Ser. No. 63/494,615, filed Apr. 6, 2023, the entire disclosure of which is incorporated herein by reference.

BACKGROUND

Modern day electronic devices often contain electronic memory configured to store data, such as volatile memory and/or non-volatile memory. Volatile memory stores data while powered (i.e., stores data when powered on), while non-volatile memory stores data even when not powered (i.e., stores data when powered on and/or powered off). Magnetoresistive random-access memory (MRAM) is one promising candidate for next generation non-volatile memory technology. For example, MRAM can offer comparable performance to volatile static random-access memory (SRAM) and be fabricated at comparable, and sometimes lower, densities with lower power consumption than volatile dynamic random-access memory (DRAM). As another example, compared to non-volatile flash memory, MRAM can offer faster access times and degrade less over time. As MRAMs are adopted to meet demands of scaled, advanced integrated circuit (IC) technology nodes, improvements are needed to realize further area/density scaling.

BRIEF DESCRIPTION OF THE DRAWINGS

The present disclosure is best understood from the following detailed description when read with the accompanying figures. It is emphasized that, in accordance with standard practice in the industry, various features are not drawn to scale and are used for illustration purposes only. Dimensions of the various features may be arbitrarily increased or reduced for clarity of discussion.

DETAILED DESCRIPTION

Figure 1:
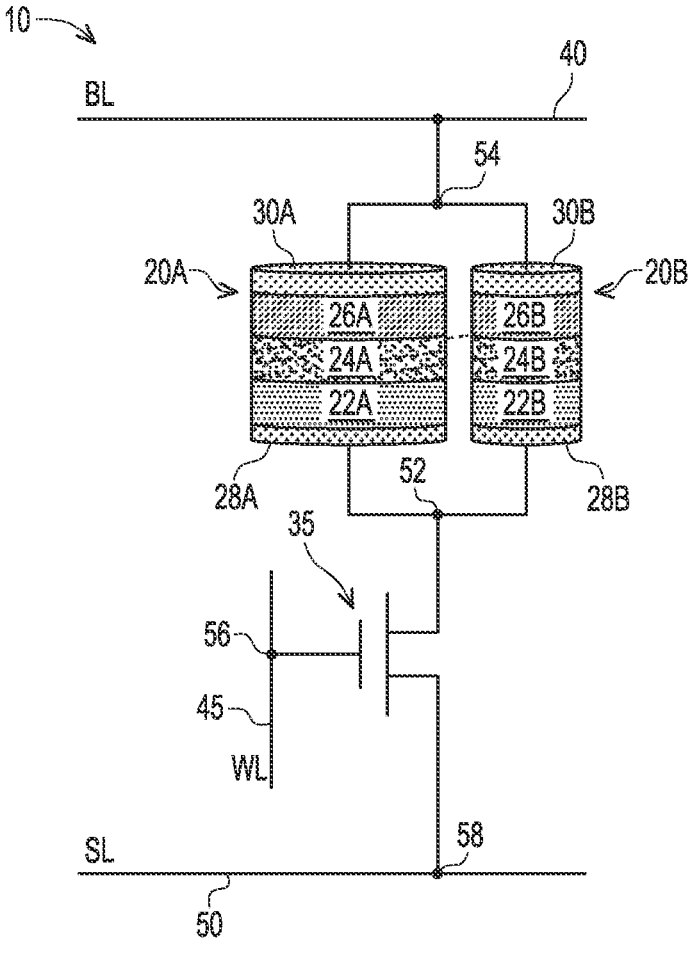
FIG. 1 is a schematic electrical diagram of a magnetoresistive random-access memory (MRAM) cell, in portion or entirety, according to various aspects of the present disclosure.

The present disclosure relates generally to memory cells and methods of operation thereof, and more particularly, to magnetoresistive random-access memory (MRAM) cells and methods of operation thereof (e.g., methods for writing thereto and reading therefrom).

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first feature and the second feature are formed in direct contact and may also include embodiments in which additional features may be formed between the first feature and the second feature, such that the first feature and the second feature may not be in direct contact. In addition, spatially relative terms, for example, "lower," "upper," "horizontal," "vertical," "above," "over," "below." "beneath," "up," "down," "top," "bottom," etc. as well as derivatives thereof (e.g., "horizontally," "downwardly," "upwardly," etc.) are used for case of the present disclosure of one features relationship to another feature. The spatially relative terms are intended to cover different orientations of the device including the features. Furthermore, when a number or a range of numbers is described with "about," "approximate," "substantially." and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. In another example, two features described as having "substantially the same" dimension and/or "substantially" oriented in a particular direction and/or or configuration (e.g., "substantially parallel") encompasses dimension differences between the two features and/or slight orientation variances of the two features from the exact specified orientation that may arise inherently, but not intentionally, from manufacturing tolerances associated with fabricating the two features. Still further, the present disclosure may repeat reference numerals and/or letters in the various examples. This repetition is for the purpose of simplicity and clarity and does not in itself dictate a relationship between the various embodiments and/or configurations described herein.

An MRAM cell is typically configured to provide two memory states and thus store one bit of information. Accordingly, multiple MRAM cells need to be combined to store more than one bit, which significantly increases an area consumed by an MRAM, along with costs of fabrication thereof. For example, to provide four memory states and store two bits, an MRAM includes a first MRAM cell for providing two memory states (and thus for storing a first bit) and a second MRAM cell for providing two memory states (and thus for storing a second bit). Combining the first MRAM cell and the second MRAM cell (i.e., two MRAM cells) to store two bits occupies an area that is twice an area occupied by a single MRAM cell. Where multiple bits of information need to be stored, a size of the MRAM can become cost prohibitive.

Embodiments of the present disclosure address such challenges by providing an MRAM cell that can provide more than two memory states, such as four memory states, while occupying less area. The MRAM cell can thus store more than one bit, such as two bits, and can be referred to as a multilevel cell (MLC). The disclosed MRAM cell includes a pair of magnetic tunneling junctions (MTJs) connected to one transistor, such as one fin-like field effect transistor (FinFET), along with a bit line, a word line, and a source line. The pair of MTJs includes a large-dimension MTJ and a small-dimension MTJ connected in parallel. For example, the large-dimension MTJ and the small-dimension MTJ have different diameters. The large-dimension MTJ can provide two memory states and store a first bit, and the small-dimension MTJ can provide two memory states and store a second bit. The large-dimension MTJ and the small-dimension MTJ can have different resistances, which provides distinct resistance states and thus distinct memory states for reading and/or writing. In operation, one or more write voltages can be supplied to the MRAM cell to change its state thereof, where each of the write voltages is configured to change a state of the large-diameter MTJ or the small-diameter MTJ.

Connecting the MTJs in parallel reduces an overall resistance of the MTJs (e.g., a combination of resistances of the MTJs), which can improve writing to the MRAM cell. Further, because of a configuration and/or characteristics of the MTJs, resistance changes are fewer during operation of the disclosed MRAM cell (e.g., MTJ resistance is not changed post-endurance cycling and/or during retention baking), such that the disclosed MRAM cell exhibits improved endurance and/or improved data retention compared to conventional MRAMs. Even further, since a single transistor is used to access more than one MTJ, the disclosed multi-bit MRAM can be fabricated without accounting for spacing between active regions, such as spacing between transistors that is considered when fabricating an MRAM that combines single-bit MRAM cells to store more than one bit. An area occupied by the disclosed multi-bit MRAM cell is thus less than an area of an MRAM that combines single-bit MRAM cells to store the same number of bits. For example, an area occupied by a two-bit MRAM cell (having four states) is less than an area occupied by an MRAM having four states that combines two single-bit MRAM cells. In some embodiments, an area occupied by the disclosed multi-bit MRAM cell is reduced by about 15% to about 20% compared to an MRAM that combines single-bit MRAM cells to store the same number of bits. Different embodiments may have different advantages, and no particular advantage is required of any embodiment.

Figure 2:
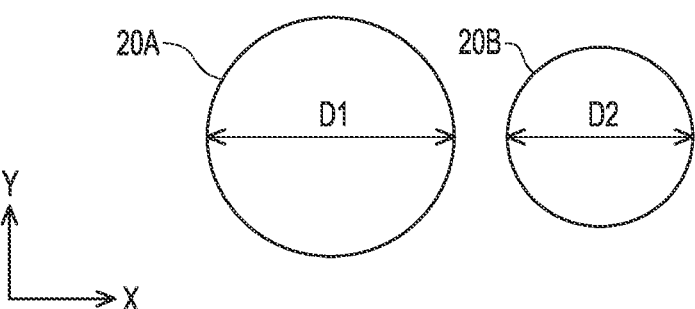
FIG. 2 is a schematic top view of magnetic tunneling junctions, in portion or entirety, of the MRAM cell of FIG. 1 according to various aspects of the present disclosure.
Figure 3:
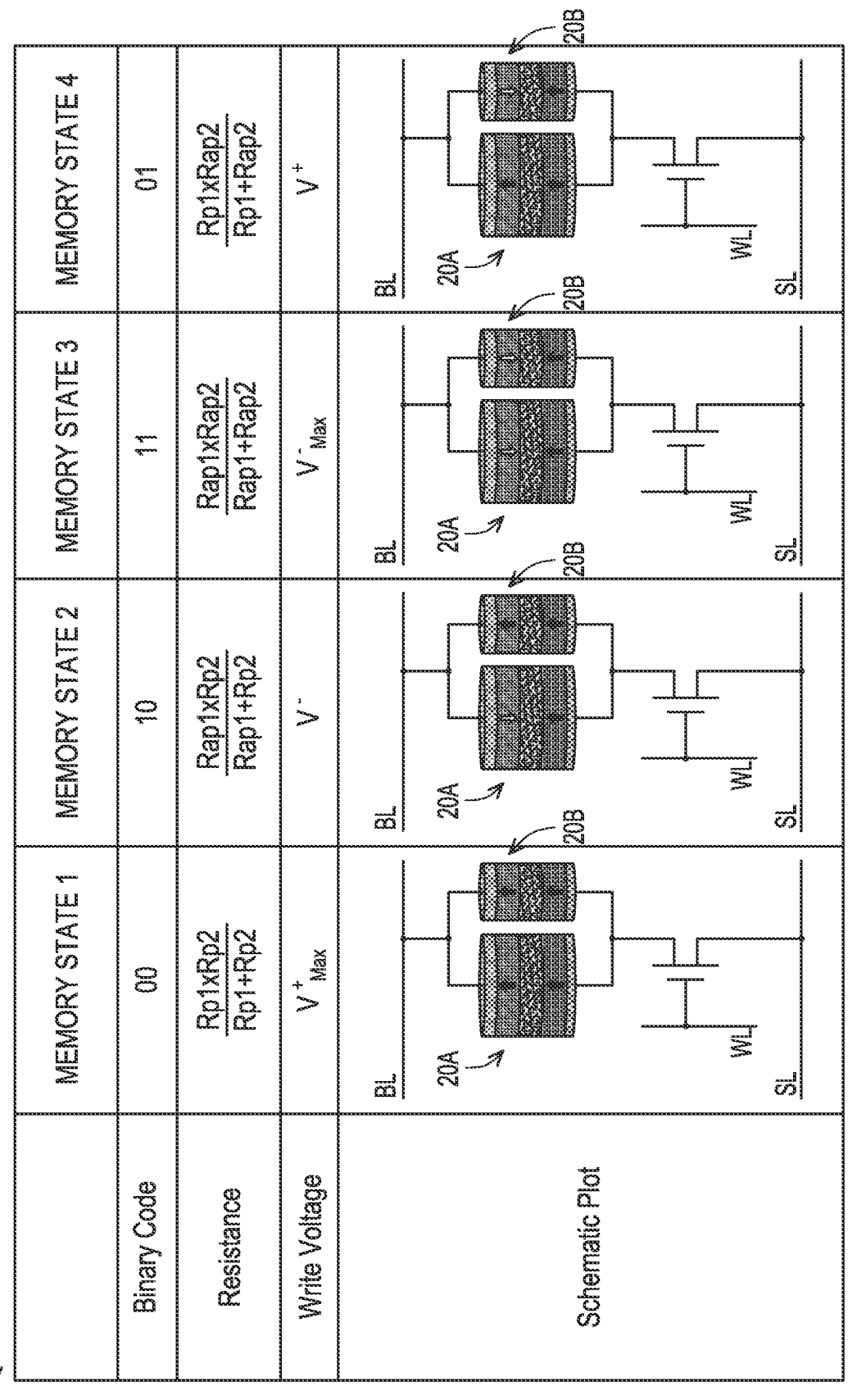
FIG. 3 is a table of memory states of the MRAM cell of FIG. 1, along with various corresponding parameters, according to various aspects of the present disclosure.

FIG. 1 is a schematic electrical diagram of an MRAM cell 10, in portion or entirety, according to various aspects of the present disclosure. MRAM cell 10 is configured to store data using magnetism (i.e., MRAM 10 stores data using magnetic states). In FIG. 1, MRAM cell 10 includes at least two magnetic tunneling junctions (MTJs), such as a MTJ 20A and a MTJ 20B, a transistor 35, a bit line (BL) 40, a word line (WL) 45, and a source line (SL) 50. As described herein, MRAM cell 10 is configured to provide more than two memory states. For example, MTJ 20A and MTJ 20B can each provide two memory states, such that MRAM cell 10 can provide four memory states. FIG. 2 is a schematic top view of MTJs, in portion or entirety, of an MRAM cell, such as MTJ 20A and MTJ 20B of MRAM cell 10, according to various aspects of the present disclosure. FIG. 3 is a table 100 of memory states of an MRAM cell, such as MRAM cell 10, along with various corresponding parameters, according to various aspects of the present disclosure. FIGS. 1-3 are discussed concurrently for ease of description and understanding of the present disclosure. FIGS. 1-3 have been simplified for the sake of clarity to better understand the inventive concepts of the present disclosure. Additional features can be added in MRAM cell 10 and/or components thereof (e.g., MTJ 20A and/or MTJ 20B), and some of the features described below can be replaced, modified, or eliminated in other embodiments of MRAM cell 10 and/or components thereof (e.g., MTJ 20A and/or MTJ 20B).

For ease of understanding, MTJ 20A and MTJ 20B are each depicted with three layers-MTJ 20A includes a ferromagnetic layer 22A, a tunnel barrier layer 24A, and a ferromagnetic layer 26A, and MTJ 20B includes a ferromagnetic layer 22B, a tunnel barrier layer 24B, and a ferromagnetic layer 26B. MTJ 20A and MTJ 20B thus each include two respective ferromagnetic layers separated by a respective thin insulating layer. One of the ferromagnetic layers (e.g., ferromagnetic layer 22A and ferromagnetic layer 22B) can have a fixed/"pinned" magnetic orientation, while the other one of the ferromagnetic layers (e.g., ferromagnetic layer 26A and ferromagnetic layer 26B) can have a variable/"free" magnetic orientation, which can be switched to one of two or more values (e.g., magnetic polarities) to store one of two or more corresponding data states. In such embodiments, ferromagnetic layer 22A and ferromagnetic layer 22B can be referred to as pinned layers and/or reference layers, and ferromagnetic layer 26A and ferromagnetic layer 26B can be referred to as free layers. While MTJ 20A and MTJ 20B include three layers in the depicted embodiment, the present disclosure contemplates MTJ 20A and/or MTJ 20B including additional layers including, but not limited to, capping layers, antiferromagnetic layers, other pinned layers, pinning layers, barrier layers, multilayer ferromagnetic layers, synthetic anti-ferromagnetic (SAF) structures (e.g., a metal layer between a top pinned ferromagnetic layer and a bottom pinned ferromagnetic layer), metal layers, other suitable layers, or a combination thereof. For example, in some embodiments, ferromagnetic layer 22A and/or ferromagnetic layer 22B can include a pinning layer and a pinned layer, where the pinned layer is between the pinning layer and a respective tunnel barrier layer.

Ferromagnetic layer 22A, ferromagnetic layer 22B, ferromagnetic layer 26A, and ferromagnetic layer 26B include iron, cobalt, nickel, other suitable magnetic material constituent, alloys thereof, or a combination thereof. For example, ferromagnetic layer 22A, ferromagnetic layer 22B, ferromagnetic layer 26A, and ferromagnetic layer 26B can include Fe, Co, Ni, FeCo, CoNi, CoFeB, FeB, FePt, FePd, CoFeTa, NiFe, CoFe, CoPt, CoPd, FePt, other alloys of Fe, Co. Ni, or a combination thereof, other suitable ferromagnetic materials, or a combination thereof. Tunnel barrier layer 24A and tunnel barrier layer 24B include metal (e.g., Mg. Al, Ti, Zn, Zr, Hf, or a combination thereof) and oxygen. For example, tunnel barrier layer 24A and/or tunnel barrier layer 24B include magnesium oxide (e.g., Mg, MgZnO, MgTaO, or a combination thereof), aluminum oxide (e.g., AlTiO and/or $Al_2O_3$), NiO, GdO, $Ta_2O_5$, $MoO_2$, $TiO_2$, $WO_2$, other suitable metal oxide material, or a combination thereof. In some embodiments, MTJ 20A includes an MgO layer (i.e., tunnel barrier layer 24A) sandwiched between two CoFeB layers (e.g., ferromagnetic layer 22A and ferromagnetic layer 26A). In some embodiments, MTJ 20B include an MgO layer (i.e., tunnel barrier layer 24B) sandwiched between two CoFeB layers (e.g., ferromagnetic layer 22B and ferromagnetic layer 26B).

MTJ 20A is disposed between a bottom electrode 28A and a top electrode 30A, and MTJ 20B is disposed between a bottom electrode 28B and a top electrode 30B. Top electrode 30A and bottom electrode 28A can provide a conductive material for accessing MTJ 20A from an upper side and a lower side, respectively, and top electrode 30B and bottom electrode 28B can provide a conductive material for accessing MTJ 20B from an upper side and a lower side, respectively. Bottom electrodes (e.g., bottom electrode 28A and/or bottom electrode 28B) and top electrode (e.g., top electrode 30A and/or top electrode 30B) each include metal and can alternatively be referred to as metal layers. For example, bottom electrode 28A, bottom electrode 28B, top electrode 30A, and top electrode 30B include titanium, tantalum, tungsten, ruthenium, platinum, iridium, gold, palladium, osmium, molybdenum, nickel, strontium, aluminum, other suitable metal, alloys thereof (e.g., TaN, TiN, other suitable alloys, or a combination thereof), or a combination thereof. In some embodiments, bottom electrode 28A and/or bottom electrode 28B is a TiN layers and top electrode 30A and/or top electrode 30B is a TiN layer. In some embodiments, bottom electrodes and top electrodes have different compositions (e.g., different metal materials or the same metal materials with different constituent concentrations, such as different metal atomic percentages). In some embodiments, bottom electrodes and top electrodes have the same composition (e.g., the same metal materials). In some embodiments, bottom electrodes and/or top electrodes have a multi-layer structure, such as a first electrode layer (e.g., a copper layer) over a second electrode layer (e.g., a titanium layer) having a different composition than the first electrode layer.

MTJ 20A and MTJ 20B are stacked along a given direction (e.g., vertically along a z-direction) between a respective bottom electrode and a respective top electrode. MTJ 20A and MTJ 20B each have a thickness along the given direction (e.g., the z-direction), where the thickness of MTJ 20A is a sum of a thickness of its layers (e.g., 22A, 24A, 26A) and the thickness of MTJ 20B is a sum of a thickness of its layers (e.g., 22B, 24B, 26B). A thickness of tunnel barrier layer 24A is less than each of a thickness of ferromagnetic layer 22A and a thickness of ferromagnetic layer 26A, and a thickness of tunnel barrier layer 24B is less than each of a thickness of ferromagnetic layer 22B and a thickness of ferromagnetic layer 26B. The thickness of tunnel barrier layer 24A and/or tunnel barrier layer 24B is sufficiently thin, such as 10 nm or less, to facilitate tunneling of electrons between respective ferromagnetic layers.

In a top view, MTJ 20A and MTJ 20B have different lateral dimensions, such as different widths (e.g., along the x-direction or the y-direction) and/or different lengths (e.g., along the x-direction or the y-direction). For example, in FIG. 2, MTJ 20A has a dimension D1 along an x-direction, MTJ 20B has a dimension D2 along the x-direction, and dimension D1 is greater than dimension D2. A ratio of dimension D2 to dimension D1 is greater than about 0.5 and less than 1 (i.e., $0.5 \leq$ dimension D2/dimension D1<1). For example, the ratio of dimension D2 to dimension D1 is about 0.8 to about 0.9 (i.e., $0.8 \leq$ dimension D2/dimension D1$\leq$0.9). Fabricating MTJs of a memory cell with a ratio of dimension D2 to dimension D1 that is less than 0.5 can undesirably increase fabrication complexity/cost of MRAM 10. For example, ratios less than 0.5 can result in spacing between MTJ 20A and MTJ 20B that is too small, which can lead to an increased aspect ratio therebetween and an increased etch aspect ratio and/or reduced etch process window when fabricating MTJ 20A and MTJ 20B. In some embodiments, dimension D1 is less than about 100 nm. In some embodiments, dimension D2 is less than about 100 nm. Configuring MTJ 20B with smaller lateral dimensions than MTJ 20A reduces an area consumed by MRAM cell 10, and as described further herein, increases a spacing between MTJ 20A and MTJ 20B, thereby enlarging an etch process window for fabricating MTJ 20A and MTJ 20B. In the depicted embodiment, since top profiles of MTJ 20A and MTJ 20B are circular shaped and/or oval shaped, dimension D1 and dimension D2 are diameters, and MTJ 20A and MTJ 20B may be cylindrically shaped. In some embodiments, MTJ 20A and MTJ 20B have square-shaped top profiles, rectangular-shaped top profiles, hexagonal-shaped top profiles, octagonal-shaped top profiles, or other suitable shaped top profiles.

Various layers of MTJ 20A and MTJ 20B may have the same or different lateral dimensions. For example, where MTJ 20A and MTJ 20B have substantially straight, parallel sidewalls, MTJ layers of MTJ 20A and MTJ 20B (e.g., 22A, 24A, and 26A, and 22B, 24B, and 26B, respectively) have substantially the same dimensions, such as the same diameters. In such embodiments, dimension D1 represents a diameter of the MTJ layers of MTJ 20A, and dimension D2 represents a diameter of the MTJ layers of MTJ 20B. In another example, where MTJ 20A and MTJ 20B have tapered sidewalls, the MTJ layers have dimensions that increase or decrease along a thickness of a respective MTJ. In such embodiments, dimension D1 and dimension D2 represent a maximum dimension (e.g., diameter) of the MTJ layers of MTJ 20A and the MTJ layers of MTJ 20B, respectively. In some embodiments, a width/diameter of a lower ferromagnetic layer of the MTJ layers (e.g., 22A and/or 22B) is greater than a width/diameter of a tunnel barrier layer of the MTJ layers (e.g., 24A and/or 24B), which is greater than a width/diameter of an upper ferromagnetic layer of the MTJ layers (e.g., 26A and/or 26B), and dimension D1 and/or dimension D2 represent the width/diameter of the lower ferromagnetic layer. In yet another example, MTJ 20A and MTJ 20B have patterned sidewall profiles (e.g., step profiles), such that the MTJ layers of MTJ 20A and MTJ 20B have different dimensions, dimension D1 and dimension D2 represent a maximum dimension of the MTJ layers of MTJ 20A and the MTJ layers of MTJ 20B, respectively. In yet another example, dimension D1 represents an average of dimensions of the MTJ layers of MTJ 20A (e.g., an average width/diameter of the MTJ layers), and dimension D2 represents an average of dimensions of the MTJ layers of MTJ 20B (e.g., an average width/diameter of the MTJ layers).

In FIG. 1, MTJ 20A and a MTJ 20B are electrically connected in parallel, MTJ 20A and a MTJ 20B are electrically connected to transistor 35 (which has a gate disposed between a first source/drain and a second source/drain), and MTJ 20A and MTJ 20B are electrically connected to bit line 40. For example, lower ferromagnetic layers (e.g., ferromagnetic layer 22A and ferromagnetic layer 22B) are coupled to a node 52, which is coupled to the first source/drain of transistor 35, and upper ferromagnetic layers (e.g., ferromagnetic layer 26A and ferromagnetic layer 26B) are coupled to a node 54, which is coupled to bit line 40. Transistor 35 is further electrically connected to word line 45 and source line 50. For example, the gate of transistor 35 (also referred to as a control terminal) is coupled to word line 45 at a node 56, and the second source/drain is coupled to source line 50 at a node 58. Node 52, node 56, and node 58 can be referred to as a first source/drain node, a gate node, and a second source/drain node, respectively, of transistor 35. In some embodiments, the first source/drain is a source of transistor 35, and the second source/drain is a drain of transistor 35. In some embodiments, the first source/drain is a drain of transistor 35, and the second source/drain is a source of transistor 35.

MTJ 20A and MTJ 20B use tunnel magnetoresistance (TMR) to store magnetic fields on their upper ferromagnetic layers (e.g., ferromagnetic layer 22A and ferromagnetic layer 22B, respectively) and/or their lower ferromagnetic layer (e.g., ferromagnetic layer 26A and ferromagnetic layer 26B, respectively). For sufficiently thin insulating layer thicknesses (i.e., sufficiently thin thickness of tunnel barrier layer 24A and tunnel barrier layer 24B, respectively), electrons can tunnel from the upper ferromagnetic layers to the lower ferromagnetic layers and/or vice versa. Data can be written to MTJ 20A and/or MTJ 20B in various manners. In some embodiments, current is passed between the upper ferromagnetic layers and the lower ferromagnetic layers, which can induce a magnetic field stored in the upper ferromagnetic layers (e.g., the free layers). In some embodiments, MTJ 20A and/or MTJ 20B utilize spin-transfer-torque (STT), where a spin-aligned or polarized electron flow is used to change a magnetic field within a free magnetic layer (e.g., the upper ferromagnetic layers) with respect to a pinned magnetic layer (e.g., the lower ferromagnetic layers). Other methods can be used to write data to MTJ 20A and/or MTJ 20B of MRAM cell 10, including various data writing methods where a magnetic field is changed within a free layer with respect to a pinned layer.

In the depicted embodiment, where MTJ 20A and MTJ 20B are each configured with a pinned layer (e.g., ferromagnetic layer 22A and ferromagnetic layer 22B, respectively) separated from a free layer (e.g., ferromagnetic layer 26A and ferromagnetic layer 26B, respectively) by a thin insulator layer (e.g., tunnel barrier layer 24A and tunnel barrier layer 24B, respectively), a magnetic orientation of the pinned layer may be static, while a magnetic orientation of the free layer can switch between a parallel configuration with respect to the magnetic orientation of the pinned layer (i.e., magnetic field of the free layer aligns with magnetic field of the pinned layer in a given direction) and an anti-parallel configuration with respect to the magnetic orientation of the pinned layer (i.e., magnetic field of the free layer aligns in a direction different, such as opposite, the magnetic field of the pinned layer). Switching between the two configurations provides each of MTJ 20A and MTJ 20B with two magnetic states that can be written to or read from in memory applications.

In operation, resistances of MTJ 20A and MTJ 20B can change in accordance with magnetic fields stored in their ferromagnetic layers due to magnetic tunnelling effects. For example, each of MTJ 20A and MTJ 20B has a low resistance state that corresponds with digitally storing data as a first bit value (e.g., a logical, binary "0") and a high resistance state that corresponds with digitally storing data as a second bit value (e.g., a logical, binary "1"). MTJ 20A is in the low resistance state when magnetic fields of its ferromagnetic layers are aligned, such as when a magnetic orientation and/or a magnetization polarity of its free layer (e.g., ferromagnetic layer 26A) is parallel to a magnetic orientation and/or a magnetization polarity of its reference layer (e.g., ferromagnetic layer 22A), and in the high resistance state when magnetic fields of its ferromagnetic layers are opposed, such as when the magnetic orientation and/or the magnetization polarity of its free layer is antiparallel to the magnetic orientation and/or the magnetization polarity of its reference layer. Similarly, MTJ 20B is in the low resistance state when magnetic fields of its ferromagnetic layers are aligned, such as when a magnetic orientation and/or a magnetization polarity of its free layer (e.g., ferromagnetic layer 26B) is parallel to a magnetic orientation and/or a magnetization polarity of its reference layer (e.g., ferromagnetic layer 22B), and in the high resistance state when magnetic fields of its ferromagnetic layers are opposed, such as when the magnetic orientation and/or the magnetization polarity of its free layer is antiparallel to the magnetic orientation and/or the magnetization polarity of its reference layer. Accordingly, MRAM cell 10 can be written to by applying a write current and/or write voltage of appropriate amplitude and/or polarity to set a magnetic state of MTJ 20A and/or a magnetic state of MTJ 20B and/or read from by measuring a resistance of MTJ 20A and/or a resistance of MTJ 20B (i.e., measuring resistance between ferromagnetic plates thereof) to determine a respective magnetic state thereof.

MRAM cell 10 (i.e., a single cell) can store two bits, each of which can have one of two values/states. Since MTJ 20A and MTJ 20B can each have one of two memory states, MRAM cell 10 is provided with four possible memory states. For example, referring to table 100 of FIG. 3, MRAM cell 10 can have:

MEMORY STATE 1, where MTJ 20A and MTJ 20B are both in a low resistance state, which corresponds with MTJ 20A digitally storing data as a logical "0" and MTJ 20B digitally storing data as a logical "0", such that MRAM cell 10 stores a logical binary code "00";

MEMORY STATE 2, where MTJ 20A is in a high resistance state and MTJ 20B is in a low resistance state, which corresponds with MTJ 20A digitally storing data as a logical "1" and MTJ 20B digitally storing data as a logical "0", such that MRAM cell 10 stores a logical binary code "10";

MEMORY STATE 3, where MTJ 20A and MTJ 20B are both in a high resistance state, which corresponds with MTJ 20A digitally storing data as a logical "1" and MTJ 20B digitally storing data as a logical "1", such that MRAM cell 10 stores a logical binary code "11"; and MEMORY STATE 4, where MTJ 20A is in a low resistance state and MTJ 20B is in a high resistance state, which corresponds with MTJ 20A digitally storing data as a logical "0" and MTJ 20B digitally storing data as a logical "1", such that MRAM cell 10 stores a logical binary code "01".

Figures 4, 5:
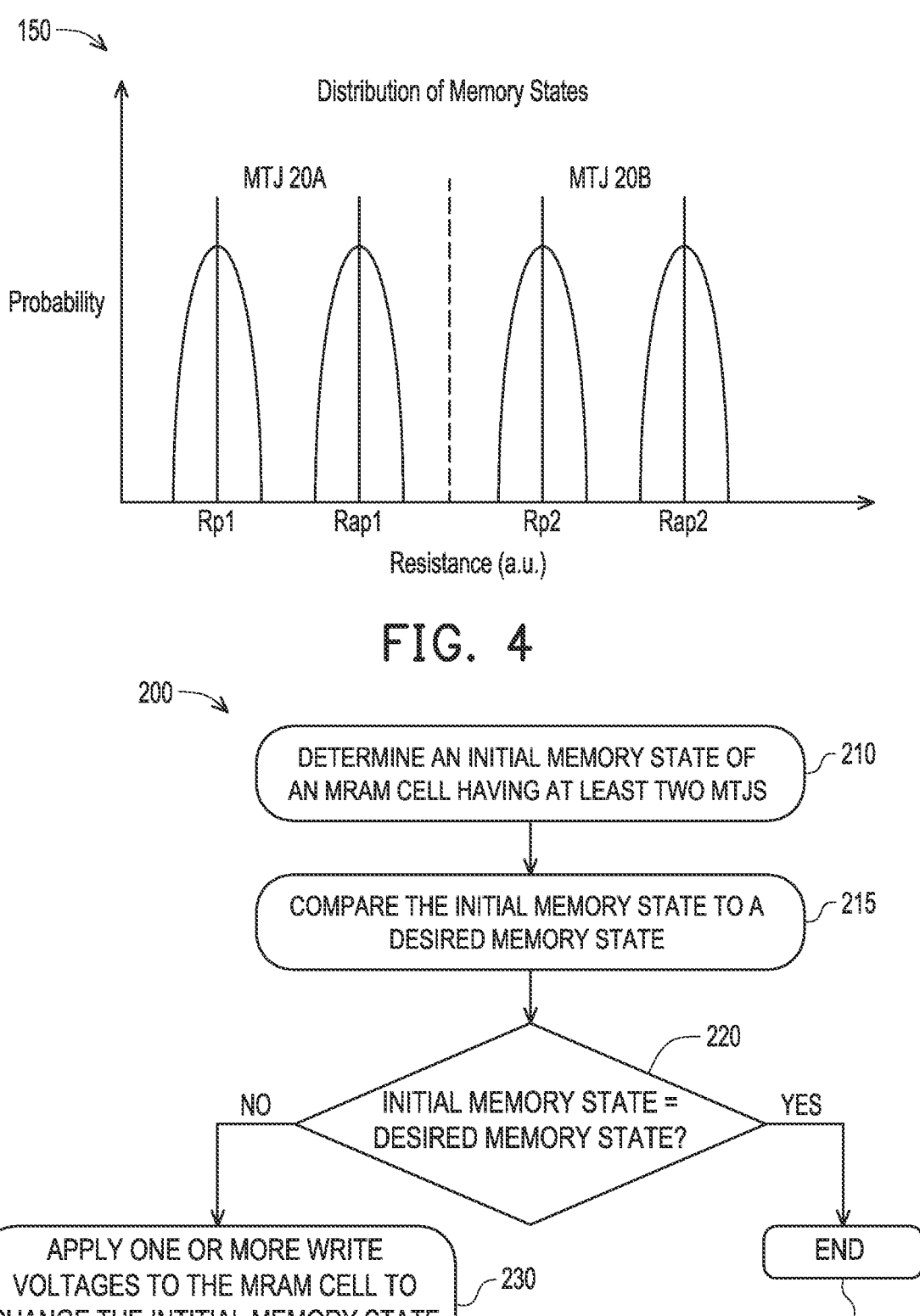
FIG. 4 is a graph that depicts a distribution of resistances of an MRAM cell, such as the MRAM cell of FIG. 1, according to various aspects of the present disclosure.
FIG. 5 is a flow chart of a method, in portion or entirety, for writing to an MRAM cell, such as the MRAM cell of FIG. 1, according to various aspects of the present disclosure.

When in the low resistance state, MTJ 20A can have a resistance Rp1, and MTJ 20B can have a resistance Rp2. When in the high resistance state, MTJ 20A can have a resistance Rap1, and MTJ 20B can have a resistance Rap2. Resistances of MTJ 20A and MTJ 20B when in the high resistance state are greater than resistances of MTJ 20A and MTJ 20B, respectively, when in the low resistance state. In other words, resistance Rap1 is greater than resistance Rp1, and resistance Rap2 is greater than resistance Rp2. Further, configuring MTJ 20A and MTJ 20B with different dimensions (e.g., diameters) provides MTJ 20A and MTJ 20B with different resistances in their high states and low states. For example, resistance Rp1 is different than resistance Rp2, and resistance Rap1 is different than resistance Rap2. In the depicted embodiment, since dimension D1 (e.g., diameter) of MTJ 20A is greater than dimension D2 (e.g., diameter) and resistance is inversely proportional to such dimension (e.g., diameter) (i.e., resistance increases as the dimension decreases), resistance Rp1 is less than resistance Rp2, and resistance Rap1 is less than resistance Rap2. In some embodiments, MTJ 20A and MTJ 20B (e.g., dimension D1 and dimension D2, respectively, thereof) are configured to provide resistance Rap2 greater than resistance Rp2, resistance Rp2 greater than resistance Rap1, and resistance Rap1 greater than resistance Ra1 (i.e., Rap2>Rp2>Rap1>Rp1). FIG. 4 is a graph 150 that depicts a distribution of resistances (e.g., resistance Rp1, resistance Rap1, resistance Rp2, and resistance Rap2) of MRAM cell 10 that arise from configuring MTJ 20A and MTJ 20B with different diameters according to various aspects of the present disclosure. In such embodiments, a resistance (R) of MRAM cell 10 depends on its memory state:

$$R = (Rp1 \times Rp2)/(Rp1 + Rp2) \text{ for MEMORY STATE 1;}$$

$$R = (Rap1 \times Rp2)/(Rap1 + Rp2) \text{ for MEMORY STATE 2;}$$

$$R = (Rap1 \times Rap2)/(Rap1 + Rap2) \text{ for MEMORY STATE 3; and}$$

$$R = (Rp1 \times Rap2)/(Rp1 + Rap2) \text{ for MEMORY STATE 4.}$$

Because MRAM cell 10 has memory states with distinct resistances, a memory state of MRAM cell 10 can be easily detected (i.e., read).

Voltages can be applied to the bit line, the word line, the source line, or a combination thereof to write the various memory states of MRAM cell 10. For example, a write voltage can be applied between bit line 40 and source line 50 to cause a magnetic orientation and/or a magnetization polarity of MTJ 20A and/or MTJ 20B to change and enter a high resistance state (and thus store a "1") or a low resistance state (and thus store a "0"). The magnetic orientation and/or the magnetization polarity can change based on a polarity and/or an amplitude of the write voltage. In some embodiments, positive write voltages (i.e., where a potential at bit line 40 is greater/higher than a potential at source line 50) are applied to MRAM cell 10 to obtain MEMORY STATE 1 and MEMORY STATE 4, and negative write voltages (i.e., where a potential at bit line 40 is less/lower than a potential at source line 50) are applied to MRAM cell 10 to obtain MEMORY STATE 2 and MEMORY STATE 3. For example, a write voltage $V^+_{Max}$ is applied to MRAM cell 10 to obtain MEMORY STATE 1, a write voltage V is applied to MRAM cell 10 to obtain MEMORY STATE 2, a write voltage V Max is applied to MRAM cell 10 to obtain MEMORY STATE 3, and a write voltage $V^+$ is applied to MRAM cell 10 to obtain MEMORY STATE 4. Write voltage $V^+_{Max}$ is greater than write voltage $V^+$ (i.e., $V^+_{Max} > V^+ > 0$), and write voltage V Max is less than write voltage $V^+$ (i.e., $V^-_{Max} < V^- < 0$).

Referring to FIG. 5, FIG. 5 is a flow chart of a method 200, in portion or entirety, for writing to an MRAM memory cell, such as MRAM cell 10, according to various aspects of the present disclosure. Method 200 can be referred to as a write operation. At block 210, method 200 includes determining an initial state of an MRAM cell having at least two MTJs, such as MRAM cell 10 having MTJ 20A and MTJ 20B. In some embodiments, the initial memory state is MEMORY STATE 1 (e.g., "00"), MEMORY STATE 2 (e.g., "10"), MEMORY STATE 3 (e.g., "11"), or MEMORY STATE 4 (e.g., "01"). In some embodiments, determining the initial state of MRAM cell 10 can include reading MRAM cell 10. In some embodiments, determining the initial state of MRAM cell 10 can include measuring a resistance of MTJ 20A to determine whether it is a low resistance state or a high resistance state and measuring a resistance of MTJ 20B to determine whether it is a low resistance state or a high resistance state.

At block 215, method 200 includes comparing the initial memory state to a desired memory state. If the initial memory state is the same as the desired memory state, method 200 proceeds to block 225 where the write operation ends. If the initial memory state is different than the desired memory state, method 200 proceeds to block 230 and one or more write voltages are applied to the MRAM cell to change the initial memory state to the desired memory state. In some embodiments, the one or more write voltages are applied to the MRAM cell as follows:

step (A): when the MRAM cell is in MEMORY STATE 1 (i.e., MTJ 20A and MTJ 20B are both in the low resistance state), the write operation at block 230 includes supplying a write voltage of a first level (e.g., write voltage V⁻) to the MRAM cell to cause the MRAM cell to enter MEMORY STATE 2 (i.e., MTJ 20A enters the high resistance state);

step (B): when the MRAM cell is in MEMORY STATE 2 (i.e., MTJ 20A is in the high resistance state while MTJ 20B is in the low resistance state), the write operation at block 230 includes supplying a write voltage of a second level (e.g., write voltage V Max) to the MRAM cell to cause the MRAM cell to enter MEMORY STATE 3 (i.e., MTJ 20B enters the high resistance state);

step (C): when the MRAM cell is in MEMORY STATE 3 (i.e., MTJ 20A and MTJ 20B are both in the high resistance state), the write operation at block 230 includes supplying a write voltage of a third level (e.g., write voltage $V^+$) to the MRAM cell to cause the MRAM cell to enter MEMORY STATE 4 (i.e., MTJ 20A enters the low resistance state); and step (D): when the MRAM cell is in MEMORY STATE 4 (i.e., MTJ 20A is in the low resistance state while MTJ 20B is in the high resistance state), the write operation at block 230 includes supplying a write voltage of a fourth level (e.g., write voltage $V^+_{Max}$) to the MRAM cell to cause the MRAM cell to enter MEMORY STATE 1 (i.e., MTJ 20B enters the low resistance state).

The first level, the second level, the third level, and the fourth level of write voltages are different, as described above. The first level, the second level, the third level, and the fourth level of write voltages can be supplied by biasing a source line (e.g., source line 50) relative to a bit line (e.g., bit line 40) and/or vice versa. In some embodiments, read/ write circuitry generates the write voltage(s) applied to MRAM cell 10 at block 230. During method 200, transistor 35 of MRAM cell 10 is turned on (i.e., selected), for example, by applying a control voltage to its gate via word line 45, which allows current to flow through MTJ 20A and/or MTJ 20B that can change their resistance states and thus their stored data values. FIG. 5 has been simplified for the sake of clarity to better understand the inventive concepts of the present disclosure. Additional steps can be provided before, during, and after method 200, and some of the steps described can be moved, replaced, or eliminated for additional embodiments of method 200.

Depending on the initial memory state and the desired memory state of the MRAM cell, method 200 at block 230 may execute step (A), step (B), step (C), step (D), or a combination thereof. In an example where an initial memory state of MRAM cell 10 is MEMORY STATE 3 (e.g., MRAM cell 10 currently stores "11") and a desired memory state of MRAM cell 10 is MEMORY STATE 2 (e.g., MRAM cell 10 needs to store "10"), method 200 at block 230 can sequentially execute step (C), step (D), and step (A) to cause MRAM cell 10 to enter MEMORY STATE 2 (i.e., "10" is written to MRAM cell 10). For example, since the initial memory state of MRAM cell 10 is MEMORY STATE 3, where MTJ 20A and MTJ 20B are both in the high resistance state, the write operation includes supplying write voltage $V^+$ to MRAM cell 10 to cause MTJ 20A to enter the low resistance state, and thus cause MRAM cell 10 to enter MEMORY STATE 4 and store "01". Then, since MTJ 20A is in the low resistance state and MTJ 20B is in the high resistance state, the write operation proceeds with supplying write voltage $V^+_{Max}$ to MRAM cell 10 to cause MTJ 20B to enter the low resistance state, and thus cause MRAM cell 10 to enter MEMORY STATE 1 and store "00". Then, since MTJ 20A and MTJ 20B are both in the low resistance state, the write operation proceeds with supplying write voltage $V''$ to MRAM cell 10 to cause MTJ 20A to enter the high resistance state, and thus cause MRAM cell 10 to enter MEMORY STATE 2 and store "10". Three write voltages are thus applied to switch MRAM cell 10 from MEMORY STATE 3 to MEMORY STATE 2.

Figure 6:
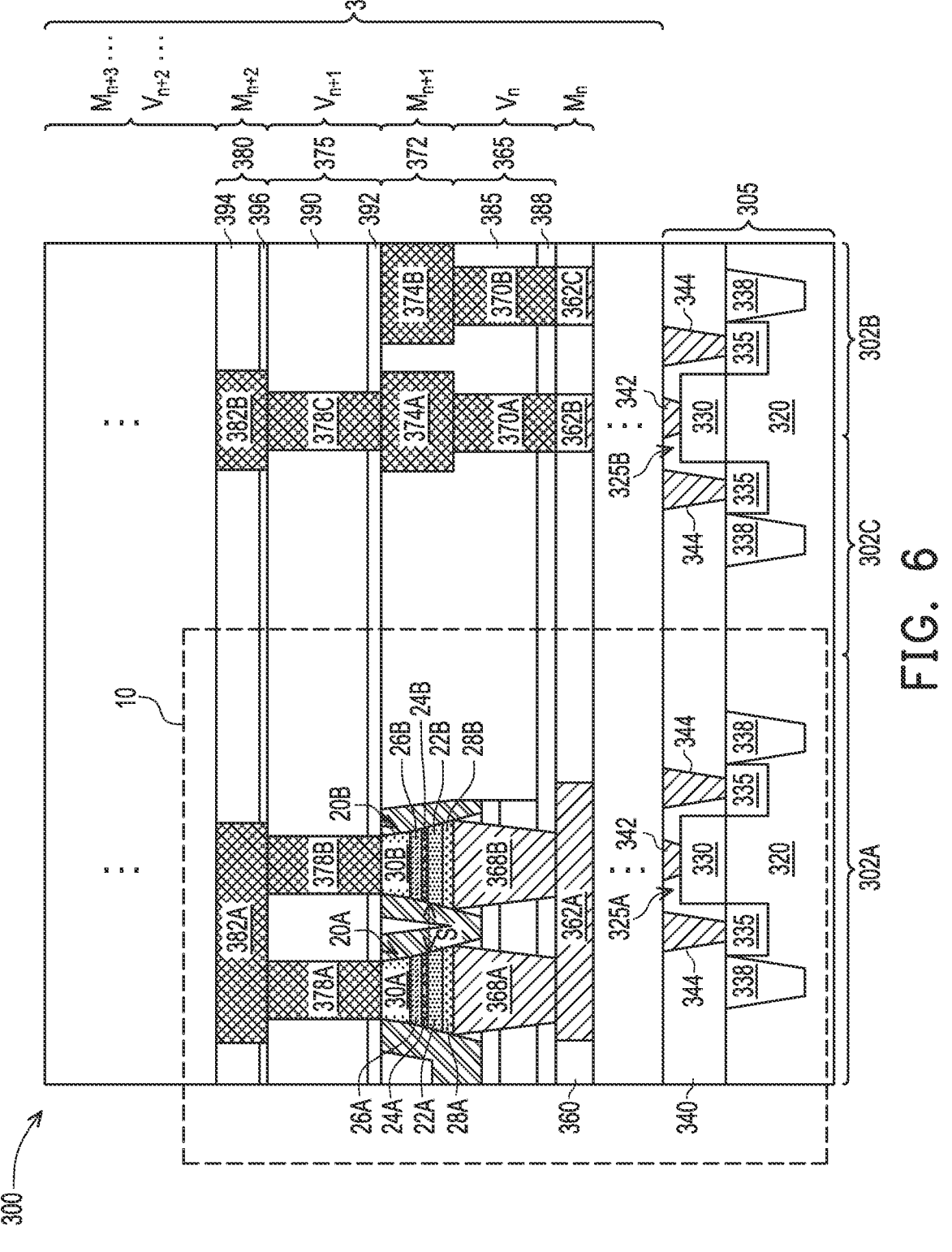
FIG. 6 a diagrammatic cross-sectional view of a device, in portion or entirety, having a logic region and a memory region that includes an MRAM cell, such as the MRAM cell of FIG. 1, according to various aspects of the present disclosure.

Referring to FIG. 6, FIG. 6 a diagrammatic cross-sectional view of a device 300, in portion or entirety, having a memory region that includes an MRAM cell, such as MRAM cell 10 of FIG. 1, according to various aspects of the present disclosure. Device 300 has a memory region 302A, a logic region 302B (i.e., core region), and an intermediate region 302C between and separating memory region 302A and logic region 302B. Memory region 302A is configured to include memory cells, such as MRAM cell 10, each of which can provide a storage device and/or a storage function. In the depicted embodiment, one or more of the memory cells, such as MRAM 10, are configured to store more than one bit, such as two bits. In some embodiments, memory region 302A is also configured with flash memory cells, other non-volatile random-access memory (NVRAM) cells, static random-access memory (SRAM) cells, dynamic random-access memory (DRAM) cells, other volatile memory cells, other suitable memory cells, or a combination thereof. Logic region 302B is configured to include standard cells, each of which can provide a logic device and/or a logic function, such as an inverter, an AND gate, an NAND gate, an OR gate, an NOR gate, a NOT gate, an XOR gate, an XNOR gate, other suitable logic device, or a combination thereof. In some embodiments, memory cells and/or logic cells include transistors and interconnect structures that combine to provide desired storage devices/functions and logic devices/functions, respectively. Device 300 can further have an analog region, a peripheral region (e.g., an input/output (I/O) region), a dummy region, other suitable region, or a combination thereof. FIG. 6 has been simplified for the sake of clarity to better understand the inventive concepts of the present disclosure. Additional features can be added in device 300 and/or components thereof, and some of the features described below can be replaced, modified, or eliminated in other embodiments of device 300 and/or components thereof.

Device 300 includes a device substrate 305 and a multilayer interconnect (MLI) feature 310 disposed over device substrate 305. Memory region 302A, logic region 302B, and intermediate region 100C share device substrate 305 and MLI feature 310. Device substrate 305 can include various device components/features, such as a semiconductor substrate, doped wells (e.g., n-wells and/or p-wells), isolation features (e.g., shallow trench isolation (STI) structures and/or other suitable isolation structures), gates (for example, a gate stack having a gate electrode over a gate dielectric), gate spacers along sidewalls of the gates, source/drain features (e.g., epitaxial source/drains), other suitable device components, or a combination thereof. Device substrate 305 can include passive devices and/or active devices, such as resistors, capacitors, inductors, diodes, p-type FETs (PFETs), n-type FETs (NFETs), metal-oxide semiconductor (MOS) FETs (MOSFETs), complementary MOS (CMOS) transistors, bipolar junction transistors (BJTs), laterally diffused MOS (LDMOS) transistors, high voltage transistors, high frequency transistors, other suitable devices, or a combination thereof. The devices can be configured to provide functionally distinct regions, such as memory region 302A and logic region 302B.

In FIG. 6, device substrate 305 is depicted with a semiconductor substrate 320 and various transistors, such as a transistor 325A in memory region 302A and a transistor 325B in logic region 302B. Transistor 325A and transistor 325B each include a respective gate structure 330 disposed between respective source/drains 335, which are disposed on, in, and/or over semiconductor substrate 320 depending on configuration. Source/drains 335 can include lightly doped source/drain regions (LDDs), heavily doped source/drain regions (HDDs), epitaxial source/drains, other source/drain feature and/or region, or a combination thereof. Transistor 325A and transistor 325B each have a channel that extends between respective source/drains 335 in semiconductor substrate 320. Each gate structure can include gate spacers disposed along a gate stack, and the gate stack can include a gate electrode disposed over a gate dielectric. Transistor 325A and transistor 325B can be configured as planar transistors, fin-like field effect transistors (FinFETs), gate-all-around (GAA) transistors, stacked transistors, or other type of transistors. Device substrate 305 can further include isolation structures 338, such as shallow trench isolation features, that separate and/or electrically isolate transistor 325A and transistor 325B from one another and/or other devices and/or components of device substrate 305. Device 300 further includes a dielectric layer 340, gate contacts 342 disposed in insulation layer 340, and source/drain contacts 344 disposed in dielectric layer 340. Dielectric layer 340 can include one or more interlayer dielectric (ILD) layers and/or one or more CESLs). Gate contacts 322 electrically connect gate structures 330 (in particular, gate electrodes thereof) to MLI feature 310, and source/drain contacts 344 electrically connect source/drains 335 to MLI feature 310.

MLI feature 310 electrically couples various devices and/or components of device substrate 305 and/or various devices and/or components of MLI feature 310 (e.g., a memory device, such as MTJ 20A and/or MTJ 20B of MRAM cell 10, disposed within MLI feature 310), such that the various devices and/or components can operate as desired. MLI feature 310 includes a combination of dielectric layers and electrically conductive layers (e.g., metal layers) configured to form various interconnect (routing) structures. The conductive layers are configured to form vertical interconnect features, such as device-level contacts and/or vias, and/or horizontal interconnect features, such as conductive lines. Vertical interconnect features typically connect horizontal interconnect features in different layers/levels (or different planes) of MLI feature 310. During operation, the interconnect structures can route signals between devices and/or components of device substrate 305 and/or MLI feature 310 and/or distribute signals (for example, clock signals, voltage signals, ground signals, etc.) to the devices and/or the device components of device substrate 305 and/or MLI feature 310. Though MLI feature 310 is depicted with a given number of dielectric layers and metal layers, the present disclosure contemplates MLI feature 310 having more or less dielectric layers and/or metal layers.

In FIG. 6, a portion of MLI feature 310 is illustrated that includes an nth metallization layer (denoted as $M_n$ metal layer (or level)), an nth via layer (denoted as $V_n$ via layer (or level)) over nth metallization layer, and an (n+1)th metallization layer (denoted as Mm+1 metal layer (or level)) over nth via layer, where n is an integer greater than or equal to 1. In the depicted embodiment, n is greater than 1 (e.g., n=3, 4, 5, etc.), where MLI feature 310 includes metallization layers (e.g., (n−1)th metallization layer and so on) and via layers (e.g., (v−1)th via layer and so on) between $M_n$ metal layer and device substrate 320. In some embodiments, n equals 4, such that $M_n$ metal layer is a fourth metal layer (i.e., M4 level), $V_n$ via layer is a fourth via layer (i.e., V4 level), and $M_{n+1}$ metal layer is a fifth metal layer (i.e., M5 level) of MLI feature 310. In some embodiments, MLI feature 310 includes metallization layers (e.g., (n+2)th metallization layer and so on) and via layers (e.g., (v+2)th via layer and so on) above $M_{n+1}$ metal layer. In furtherance of the depicted embodiment, $V_n$ via layer is directly above, physically connected, and electrically connected to $M_n$ metal layer and $M_{n+1}$ metal layer is directly above, physically connected, and electrically connected to $V_n$ via layer. In such embodiments, $V_n$ via layer physically and electrically connects $M_n$ metal layer and $M_{n+1}$ metal layer. $M_n$ metal layer, $V_n$ via layer, and $M_{n+1}$ metal layer are also electrically connected to device substrate 320.

$M_n$ metal layer includes a dielectric layer 360 having $M_n$ metal lines disposed therein, such as a metal line 362A, a metal line 362B, and a metal line 362C. $V_n$ via layer includes a dielectric layer 365 having $V_n$ vias disposed therein, such as a bottom electrode via 368A, a bottom electrode via 368B, a via 370A, and a via 370B. $M_{n+1}$ metal layer includes a dielectric layer 372 having MTJs disposed therein, such as MTJ 20A and MTJ 20B, and $M_{n+1}$ metal lines disposed therein, such as a metal line 374A and a metal line 374B. $V_{n+1}$ via layer includes a dielectric layer 375 having $V_{n+1}$ vias disposed therein, such as a via 378A and a via 378B. $M_{n+2}$ metal layer includes a dielectric layer 380 having $M_{n+2}$ metal lines disposed therein, such as a metal line 382A and a metal line 382B. In memory region 302A, bottom electrode via 368A and bottom electrode via 368B are physically and electrically connected to metal line 362A, and via 378A and via 378B are physically and electrically connected to metal line 382B and metal line 362C. In logic region 302B, via 370A and via 370B are physically and electrically connected to metal line 362B and metal line 362C, respectively; metal line 374A and metal line 374B are physically and electrically connected to via 370A and via 370B, respectively; and via 378C is physically and electrically connected to metal line 340A. Metal lines 362A-362C can be electrically connected to device substrate 320 and/or device components thereon by MLI feature 310, such as by underlying metallization layers and/or underlying via layers thereof.

As described herein, MTJ 20A and MTJ 20B are connected in parallel. In some embodiments, bottom electrode 28A of MTJ 20A is electrically connected to bottom electrode 28B of MTJ 20B by bottom electrode vias (e.g., bottom electrode via 368A and bottom electrode via 368B) and metal line 362A, and top electrode 30A of MTJ 20A is electrically connected to top electrode 30B of MTJ 20B by vias (e.g., via 378A and via 378B) and metal line 382A. In some embodiments, metal line 382A is a bit line, such as bit line 40, of MRAM cell 10. In some embodiments, metal line 382A is electrically connected to a bit line (e.g., a metal line) disposed in a metallization layer of MLI feature 310 that is above Mm+2 metal layer. Various interconnect structures (e.g., vias and/or metal lines) can provide the electrical connection between metal line 382A and the bit line disposed thereover. In some embodiments, transistor 325A (e.g., transistor T) is electrically connected to MTJ 20A and MTJ 20B by MLI feature 310 and one of source/drain contacts 344. For example, metal line 362A (connected to bottom electrodes of MTJ 20A and MTJ 20B) can be electrically connected to one of source/drains 335 of transistor 325A by interconnect structures in metallization layers between $M_n$ metal layer of MLI feature 310 and device substrate 320 and one of source/drain contacts 344. The other one of source/drains 335 of transistor 325A can be electrically connected to a metal line in MLI feature 310 that is configured as a source line (also referred to as a select line), such as source line 50. In some embodiments, gate structure 330 is electrically connected to a metal line in MLI feature 310 that is configured as a word line (WL), such as word line 45. In some embodiments, metal line 362A and/or metal line 362B is electrically connected to transistor 325B, such as gate structure 330 and/or source/drains 335 thereof, to facilitate operation thereof.

Dielectric layer 360 includes an ILD layer (and, in some embodiments, a contact etch stop layer (CESL)), dielectric layer 365 includes an ILD layer 385 disposed over a CESL 388, dielectric layer 372 includes an ILD layer 390 disposed over a CESL 392, dielectric layer 375 includes an ILD layer and/or over a CESL, and dielectric layer 380 includes an ILD layer 394 disposed over a CESL 396. The ILD layers of MLI feature 310 (e.g., ILD layer 360, ILD layer 385, ILD layer 390, ILD layer 394, etc.) include a dielectric material, such as silicon oxide, tetraethylorthosilicate (TEOS) oxide, phosphosilicate glass (PSG), boron-doped silicate glass (BSG), boron-doped PSG (BPSG), low-k dielectric material, other suitable dielectric material, or a combination thereof. Exemplary low-k dielectric materials include fluorosilicate glass (FSG), carbon-doped oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the ILD layers include a low-k dielectric material, such as a carbon-doped oxide, or an extreme low-k dielectric material, such as a porous carbon-doped oxide. The CESLs (e.g., CESL 388, CESL 392, CESL 396, etc.) include a material different than their respective overlying ILD layer, such as a dielectric material that is different than the dielectric material of the ILD layer. For example, where an ILD layer includes a low-k dielectric material (having, for example, a dielectric constant that is less than a dielectric constant of silicon oxide (e.g., k<3.9)), a CESL can include silicon and nitrogen, such as silicon nitride, silicon oxynitride, and/or silicon carbonitride. The ILD layers and/or the CESLs may have a multilayer structure having multiple dielectric materials. Compositions, thicknesses, and numbers of layers of the ILD layers and/or the CESLS can be configured the same or different.

Metal lines (e.g., metal lines 362A-362C, metal line 374A, metal line 374B, metal line 382A, metal line 382B, etc.) and vias (e.g., bottom electrode via 368A, bottom electrode via 368B, via 370A, via 370B, vias 378A-378C, etc.) include a conductive material, including aluminum, copper, titanium, tantalum, tungsten, ruthenium, cobalt, iridium, palladium, platinum, nickel, alloys thereof, silicides thereof, other suitable metals, or a combination thereof.

Transistor 325A and transistor 325B are fabricated by front-end-of-line (FEOL) processing, and MTJ 20A and MTJ 20B are fabricated by back-end-of-line processing (e.g., during fabrication of MLI feature 310). MRAM 10 thus includes an FEOL structure (e.g., transistor 325A and/or transistor 35) and a BEOL structure (e.g., MTJ 20A and MTJ 20B). Fabrication of MTJ 20A and MTJ 20B can include depositing MTJ layers (e.g., a pinned layer, a tunneling barrier layer, and a free layer) over dielectric layer 360 and patterning the MTJ layers to form two MTJ stacks having an opening (i.e., a spacing S) therebetween. The patterning can include one or more lithography processes and one or more etching processes. Since a dimension (e.g., a diameter and/or a width) of MTJ 20B is less than a dimension of MTJ 20A, spacing S between MTJ 20A and MTJ 20B is sufficiently large to ensure an adequate etch process window and/or etch aspect ratio (i.e., a ratio of a depth to a width of an opening formed between the two MTJ stacks (i.e., spacing S)). An area of an MRAM cell having more than two memory states can thus be reduced with minimal impact to etch process windows associated with fabricating the MRAM cell, thereby minimizing its fabrication complexity/cost.

Figures 7, 8:
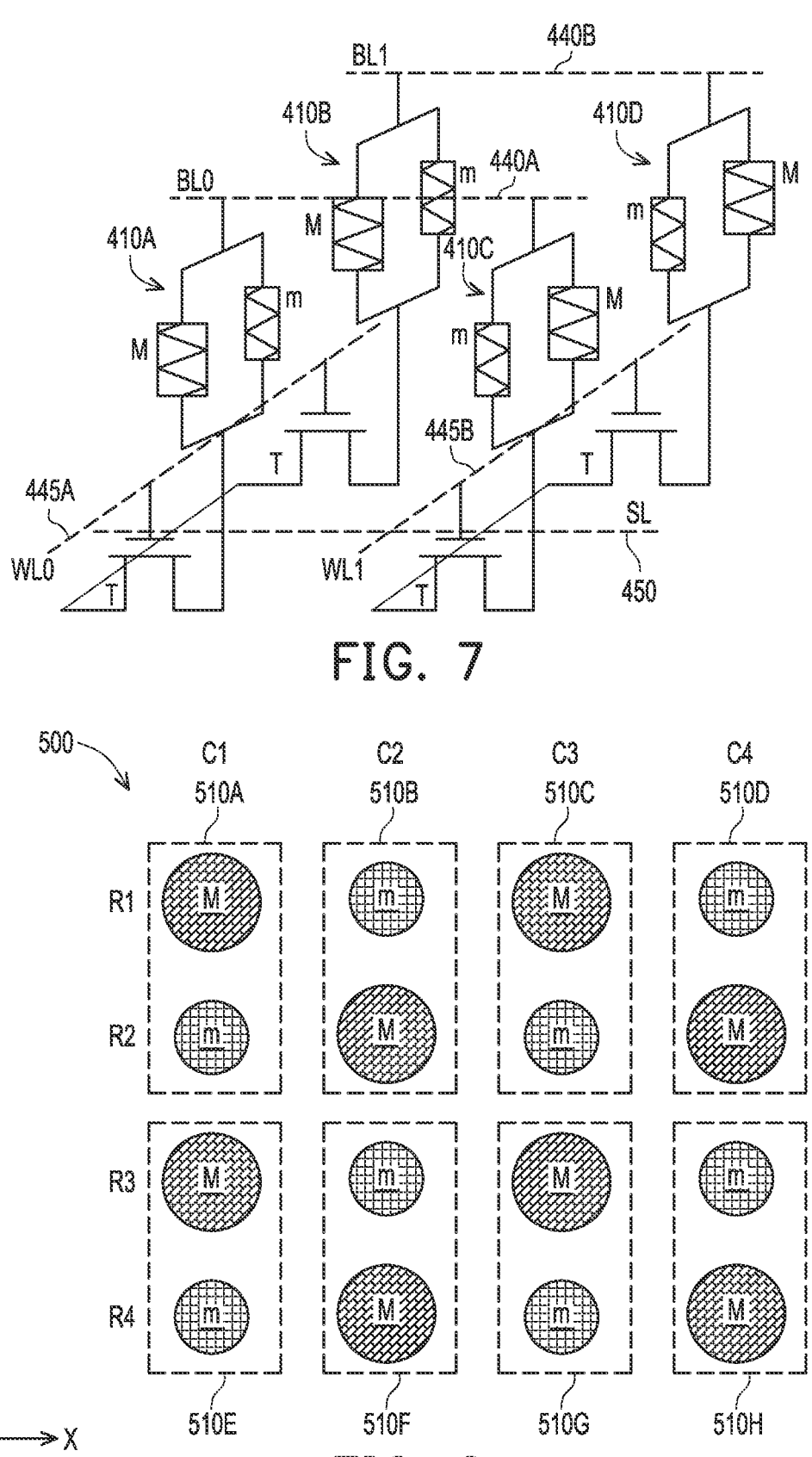
FIG. 7 is a schematic electrical diagram of an MRAM array, in portion or entirety, according to various aspects of the present disclosure.
FIG. 8 is a schematic top view of an MRAM array, in portion or entirety, according to various aspects of the present disclosure.

Referring to FIG. 7, FIG. 7 is a schematic electrical diagram of an MRAM array 400, in portion or entirety, according to various aspects of the present disclosure. MRAM array 400 includes more than one MRAM cell, such as an MRAM cell 410A, an MRAM cell 410B, an MRAM cell 410C, and an MRAM cell 410D. Each of MRAM cells 410A-410D is configured to provide more than two memory states, such as four memory states. MRAM cells 410A-410D are similar to MRAM cell 10 described herein. For example, each of MRAM cells 410A-410D includes a first MTJ (M) having a first dimension (e.g., MTJ 20A), a second MTJ (m) having a second dimension that is less than the first dimension (e.g., MTJ 20B), and a transistor (T) (e.g., transistor 35). MRAM cells 410A-410D are arranged in rows and columns, such as a first column that includes MRAM cell 410A and MRAM cell 410B, a second column that includes MRAM cell 410C and MRAM cell 410D, a first row that includes MRAM cell 410A and MRAM cell 410C, and a second row that includes MRAM cell 410B and MRAM cell 410D. MRAM array 400 can thus be referred to as a 2×2 MRAM array. FIG. 7 has been simplified for the sake of clarity to better understand the inventive concepts of the present disclosure. Additional features can be added in MRAM array 400 and/or components thereof, and some of the features described below can be replaced, modified, or eliminated in other embodiments of MRAM array 400 and/or components thereof.

In each of MRAM cells 410A-410D, first MTJ and second MTJ are electrically connected in parallel, first MTJ and second MTJ (in particular, lower ferromagnetic layers thereof) are electrically connected to transistor T (in particular, a source/drain thereof), first MTJ and second MTJ are electrically connected to a respective bit line, and transistor T is electrically connected to a respective word line and a respective source line. In the depicted embodiment, MRAM array 400 includes more than one bit line, such as a bit line 440A (BL0) and a bit line 440B (BL1), more than one word line, such as a word line 445A (WL0) and a word line 445B (WL1), and a source line, such as a source line 450 (SL). MRAM cells in a row are connected to a same bit line. For example, MRAM cell 410A and MRAM cell 410C (in particular, upper ferromagnetic layers of first MTJ and second MTJ thereof) are electrically connected to bit line 440A, and MRAM cell 410B and MRAM cell 410D are electrically connected to bit line 440B (in particular, upper ferromagnetic layers of first MTJ and second MTJ thereof). Because MRAM cells 410A-410D each store more than one bit (e.g., two bits), fewer bit lines are needed in MRAM array 400 than an MRAM array that combines single-bit MRAM cells to store a same number of bits (e.g., eight). MRAM array 400 can thus be configured with wider bit lines, which can reduce and/or eliminate sneak current compared to conventional MRAM arrays.

Further, in MRAM array 400, MRAM cells in a column are connected to a same word line. For example, MRAM cell 410A and MRAM cell 410B (in particular, gates of transistors T thereof) are electrically connected to word line 445A, and MRAM cell 410C and MRAM cell 410D are electrically connected to word line 445B (in particular, gates of transistors T thereof). Further, in the depicted embodiment, MRAM cells 410A-410D are connected to a same source line. For example, transistors T (in particular, source/drains thereof) are electrically connected to source line 450. Each transistor of MRAM cell in MRAM array 400 is thus connected to two MTJs, a respective word line, and a respective source line.

FIG. 8 is a schematic top view of an MRAM array 500, in portion or entirety, according to various aspects of the present disclosure. MRAM array 500 includes more than one MRAM cell, such as an MRAM cell 510A, an MRAM cell 510B, an MRAM cell 510C, an MRAM cell 510D, an MRAM cell 510E, an MRAM cell 510F, an MRAM cell 510G, and an MRAM cell 510H. Each of MRAM cells 510A-510H is configured to provide more than two memory states, such as four memory states. For example, each of MRAM cells 510A-510H can be configured similar to MRAM cell 10 described herein, such that each of MRAM cells 510A-510H includes a first MTJ (M) having a first dimension (e.g., MTJ 20A), a second MTJ (m) having a second dimension that is less than the first dimension (e.g., MTJ 20B), and a transistor (T) (e.g., transistor 35). MRAM cells 510A-510H are arranged in rows (e.g., R1, R2, R3, and R4) and columns (e.g., C1, C2, C3, and C4) to provide a 4×4 MRAM array. In the depicted embodiment, MRAM cells 510A-510H are arranged to provide an MTJ matrix that alternates the first MTJs and the second MTJs. For example, MRAM cells 510A-510H are arranged and oriented to provide R1 with a first MTJ-second MTJ pattern, R2 with a second MTJ-first MTJ pattern, R3 with a first MTJ-second MTJ pattern, and R4 with a second MTJ-first MTJ pattern, which further provides C1 with a first MTJ-second MTJ pattern, C2 with a second MTJ-first MTJ pattern, C3 with a first MTJ-second MTJ pattern, and C4 with a second MTJ-first MTJ pattern. The MTJ matrix thus includes first MTJs between second MTJs and/or second MTJs between first MTJs. This configuration enables condensed spacing between MTJs and/or MRAM cells 510A-510H, which advantageously reduces an overall area consumed by MRAM array 500. FIG. 8 has been simplified for the sake of clarity to better understand the inventive concepts of the present disclosure. Additional features can be added in MRAM array 500 and/or components thereof, and some of the features described below can be replaced, modified, or eliminated in other embodiments of MRAM array 500 and/or components thereof.

The present disclosure provides for many different embodiments. MRAM cells are disclosed herein that can provide more than two memory states, such as four memory states. An exemplary MRAM cell is configured to store more than one bit. The MRAM cell includes a first magnetic tunneling junction (MTJ) and a second MTJ connected in parallel. The first MTJ has a first diameter, the second MTJ has a second diameter, and the second diameter is less than the first diameter. The MRAM cell further includes a transistor connected to the first MTJ and the second MTJ, a bit line connected to the first MTJ and the second MTJ, a word line connected to the transistor, and a source line connected to the transistor. In some embodiments, a ratio of the second diameter to the first diameter is at least 0.5 and less than 1.0.

In some embodiments, each of the first MTJ and the second MTJ has a high resistance state and a low resistance state. The first MTJ has a first resistance when in the high resistance state and a second resistance when in the low resistance state. The second MTJ has a third resistance when in the high resistance state and a fourth resistance when in the low resistance state. The first resistance, the second resistance, the third resistance, and the fourth resistance are different. In some embodiments, the third resistance is greater than the fourth resistance, the fourth resistance is greater than the first resistance, and the first resistance is greater than the second resistance. In some embodiments, the first diameter of the first MTJ and the second diameter of the second MTJ are configured to provide the first resistance, the second resistance, the third resistance, and the fourth resistance with different values.

In some embodiments, the first MTJ includes a first free layer, a first pinned layer, and a first tunneling barrier layer disposed between the first free layer and the first pinned layer, and the second MTJ includes a second free layer, a second pinned layer, and a second tunneling barrier layer disposed between the second free layer and the second pinned layer. The first free layer and the second free layer are connected to the bit line. The first pinned layer and the second pinned layer are connected to the transistor.

In some embodiments, the first MTJ has a first configuration of layers, and the second MTJ has a second configuration of layers. The first configuration of layers can be the same as or different than the second configuration of layers. In some embodiments, the transistor is a front-end-of-line structure and the first MTJ and the second MTJ are back-end-of-line structures.

An exemplary nonvolatile memory structure includes a plurality of MRAM cells. Each of the plurality of MRAM cells includes a first magnetic tunneling junction (MTJ) and a second MTJ connected in parallel. The first MTJ and the second MTJ are connected to a respective bit line. The first MTJ has a first diameter, the second MTJ has a second diameter, and the second diameter is less than the first diameter. Each of the plurality of MRAM cells further includes a transistor connected to the first MTJ and the second MTJ. The transistor is connected to a respective word line and a respective source line. In some embodiments, a ratio of the second diameter to the first diameter is at least 0.5 and less than 1.0.

In some embodiments, the plurality of MRAM cells are arranged to alternate the first MTJs and the second MTJs. In some embodiments, the transistors of the plurality of MRAM cells are connected to a same source line. In some embodiments, for each of the plurality of MRAM cells, each of the first MTJ and the second MTJ has a high resistance state and a low resistance state. The first MTJ has a first resistance when in the high resistance state and a second resistance when in the low resistance state. The second MTJ has a third resistance when in the high resistance state and a fourth resistance when in the low resistance state. The first resistance, the second resistance, the third resistance, and the fourth resistance are different. In some embodiments, the third resistance is greater than the fourth resistance, the fourth resistance is greater than the first resistance, and the first resistance is greater than the second resistance.

An exemplary method of writing to an MRAM cell having a first MTJ and a second MTJ connected in parallel, where each of the first MTJ and the second MTJ has a low resistance state and a high resistance state, can include supplying one or more write voltages to the MRAM cell. Supplying the one or more write voltages to the MRAM cell includes, when the first MTJ is in the low resistance state and the second MTJ is in the low resistance state, supplying a first write voltage to the MRAM cell that causes the first MTJ to enter the high resistance state. Supplying the one or more write voltages to the MRAM cell includes, when the first MTJ is in the high resistance state and the second MTJ is in the low resistance state, supplying a second write voltage to the MRAM cell that causes the second MTJ to enter the high resistance state. Supplying the one or more write voltages to the MRAM cell includes, when the first MTJ is in the high resistance state and the second MTJ is in the high resistance state, supplying a third write voltage to the MRAM cell that causes the first MTJ to enter the low resistance state. Supplying the one or more write voltages to the MRAM cell includes, when the first MTJ is in the low resistance state and the second MTJ is in the high resistance state, supplying a fourth write voltage to the MRAM cell that causes the second MTJ to enter the low resistance state.

In some embodiments, the method further includes determining an initial memory state of the MRAM cell, comparing the initial memory state to a desired memory state of the MRAM cell, and if the initial memory state is different than the desired memory state, performing the supplying of the one or more write voltages to the MRAM cell. In some embodiments, the first MTJ and the second MTJ are connected to a transistor, and the method further includes supplying a control voltage to the transistor.

In some embodiments, the first write voltage is positive, the second write voltage is negative, the third write voltage is negative, and the fourth write voltage is positive. In some embodiments, the first write voltage is greater than the fourth write voltage, and the second write voltage is greater than the third write voltage.

In some embodiments, the first MTJ has a first diameter and the second MTJ has a second diameter. The second diameter is different than the first diameter to provide the first MTJ with a first resistance when in the high resistance state and a second resistance when in the low resistance state and the second MTJ with a third resistance when in the high resistance state and a fourth resistance when in the low resistance state. The first resistance, the second resistance, the third resistance, and the fourth resistance are different.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetoresistive random-access memory (MRAM) cell configured to store more than one bit, the MRAM cell comprising:

a first magnetic tunneling junction (MTJ) and a second MTJ connected in parallel, wherein the first MTJ has a first diameter, the second MTJ has a second diameter, and the second diameter is less than the first diameter;

a transistor connected to the first MTJ and the second MTJ;

a bit line connected to the first MTJ and the second MTJ;

a word line and a source line connected to the transistor;

wherein the first MTJ has a first high resistance and a first low resistance and the second MTJ has a second high resistance and a second low resistance;

wherein the first MTJ and the second MTJ are configured to provide the second high resistance greater than the second low resistance, the second low resistance greater than the first high resistance, and the first high resistance greater than the first low resistance ; and wherein:

the first MTJ and the second MTJ are configured to provide the first low resistance and the second low resistance, respectively, upon application of a first positive write voltage to the MRAM cell, the first MTJ and the second MTJ are configured to provide the first low resistance and the second high resistance, respectively, upon application of a second positive write voltage to the MRAM cell, wherein the second positive write voltage and the first positive write voltage are different, the first MTJ and the second MTJ are configured to provide the first high resistance and the second low resistance, respectively, upon application of a first negative write voltage to the MRAM cell, and the first MTJ and the second MTJ are configured to provide the first high resistance and the second high resistance, respectively, upon application of a second negative write voltage to the MRAM cell, wherein the second negative write voltage and the first negative write voltage are different.

2. The MRAM cell of claim 1, wherein the first MTJ and the second MTJ are in a same column of an MRAM cell array, the first MTJ is in a first row of the MRAM cell array, and the second MTJ is in a second row of the MRAM cell array.

3. The MRAM cell of claim 1, wherein the first positive write voltage is greater than the second positive write voltage, and the first negative write voltage is greater than the second negative write voltage.

4. The MRAM cell of claim 1, wherein the transistor is a fin-like field effect transistor.

5. The MRAM cell of claim 1, wherein:

the first MTJ includes a first free layer, a first pinned layer, and a first tunneling barrier layer disposed between the first free layer and the first pinned layer;

the second MTJ includes a second free layer, a second pinned layer, and a second tunneling barrier layer disposed between the second free layer and the second pinned layer;

the first free layer and the second free layer are connected to the bit line; and the first pinned layer and the second pinned layer are connected to the transistor.

6. The MRAM cell of claim 1, wherein:

a ratio of the second diameter to the first diameter is at least 0.5; and the ratio of the second diameter to the first diameter is less than 1.0.

7. The MRAM cell of claim 1, wherein the first MTJ has a first configuration of layers, the second MTJ has a second configuration of layers, and the first configuration of layers is the same as the second configuration of layers.

8. The MRAM cell of claim 1, wherein the first MTJ has a first configuration of layers, the second MTJ has a second configuration of layers, and the first configuration of layers is different than the second configuration of layers.

9. The MRAM cell of claim 1, wherein the transistor is a front-end-of-line structure and the first MTJ and the second MTJ are back-end-of-line structures.

10. A nonvolatile memory structure comprising:

a plurality of magnetoresistive random-access memory (MRAM) cells, wherein each of the plurality of MRAM cells includes:

a first magnetic tunneling junction (MTJ) and a second MTJ connected in parallel, wherein the first MTJ and the second MTJ are connected to a respective bit line, the first MTJ has a first diameter, the second MTJ has a second diameter, and the second diameter is less than the first diameter, and a transistor connected to the first MTJ and the second MTJ, wherein the transistor is connected to a respective word line and a respective source line; and wherein first MTJs and second MTJs of the plurality of MRAM cells are arranged to provide first rows having a first MTJ-second MTJ pattern and second rows having a second MTJ-first MTJ pattern, wherein the first rows interleave the second rows.

11. The nonvolatile memory structure of claim 10, wherein the first MTJs and the second MTJs of the plurality of MRAM cells are further arranged to provide first columns having the first MTJ-second MTJ pattern and second columns having the second MTJ-first MTJ pattern, wherein the first columns interleave the second columns.

12. The nonvolatile memory structure of claim 10, wherein:

for each of the plurality of MRAM cells, each of the first MTJ and the second MTJ has a high resistance state and a low resistance state;

the first MTJ has a first resistance when in the high resistance state and a second resistance when in the low resistance state;

the second MTJ has a third resistance when in the high resistance state and a fourth resistance when in the low resistance state; and the first resistance, the second resistance, the third resistance, and the fourth resistance are different.

13. The nonvolatile memory structure of claim 12, wherein the third resistance is greater than the fourth resistance, the fourth resistance is greater than the first resistance, and the first resistance is greater than the second resistance.

14. The nonvolatile memory structure of claim 10, wherein transistors of a group of the plurality of MRAM cells are connected to a same source line.

15. The nonvolatile memory structure of claim 10, wherein:

a ratio of the second diameter to the first diameter is at least 0.5; and the ratio of the second diameter to the first diameter is less than 1.0.

16. A magnetoresistive random-access memory (MRAM) cell configured to store more than one bit, the MRAM cell comprising:

a first magnetic tunneling junction (MTJ) and a second MTJ connected in parallel, wherein the first MTJ has a first diameter, the second MTJ has a second diameter, and the second diameter is less than the first diameter;

a bit line and a source line, wherein the bit line is connected to a first terminal of the first MTJ and the second MTJ and the source line is connected to a second terminal of the first MTJ and the second MTJ, and further wherein the bit line and the source line are configured for application of a write voltage therebetween, wherein the write voltage includes a first negative voltage, a second negative voltage, a first positive voltage, and a second positive voltage;

wherein each of the first MTJ and the second MTJ has a high resistance state and a low resistance state, the first MTJ has a first resistance when in the high resistance state and a second resistance when in the low resistance state, and the second MTJ has a third resistance when in the high resistance state and a fourth resistance when in the low resistance state;

wherein the first resistance, the second resistance, the third resistance, and the fourth resistance are different; and wherein:

when the first MTJ is in the low resistance state and the second MTJ is in the low resistance state, the first MTJ is configured to enter the high resistance state upon application of the first negative voltage, when the first MTJ is in the high resistance state and the second MTJ is in the low resistance state, the second MTJ is configured to enter the high resistance state upon application of the second negative voltage, wherein the second negative voltage is less than the first negative voltage, when the first MTJ is in the high resistance state and the second MTJ is in the high resistance state, the first MTJ is configured to enter the low resistance state upon application of the first positive voltage, and when the first MTJ is in the low resistance state and the second MTJ is in the high resistance state, the second MTJ is configured to enter the low resistance state upon application of the second positive voltage, wherein the second positive voltage is greater than the first positive voltage.

17. The MRAM cell of claim 16, wherein a ratio of the second diameter to the first diameter is about 0.8 to about 0.9.

18. The MRAM cell of claim 16, wherein each of the first diameter and the second diameter is less than about 100 nm.

19. The MRAM cell of claim 16, wherein the first MTJ and the second MTJ are in a same column of an MRAM cell array, the first MTJ is in a first row of the MRAM cell array, and the second MTJ is in a second row of the MRAM cell array.

20. The MRAM cell of claim 16, wherein the first MTJ and the second MTJ are disposed within a multilayer interconnect structure disposed over a device substrate.

* * * * *